(12) United States Patent
Wuerstlein et al.

(10) Patent No.: US 10,734,801 B2
(45) Date of Patent: Aug. 4, 2020

(54) ELECTRONIC CONTROL DEVICE

(71) Applicant: BROSE FAHRZEUGTEILE GMBH & CO. KOMMANDITGESELLSCHAFT, BAMBERG, Bamberg (DE)

(72) Inventors: Holger Wuerstlein, Zeil am Main (DE); Florian Pohl, Ebersdorf (DE); Luca Schaetzlein, Eibelstadt (DE); Stefan Mutzl, Kitzingen (DE); Johannes Stroehlein, Tschirn (DE); Maik Ruemmler, Breitenguessbach (DE)

(73) Assignee: BROSE FAHRZEUGTEILE GMBH & CO. KAMMANDITGESELLSCHAFT, BAMBERG, Bamberg (DE)

( * ) Notice: Subject to any disclaimer, the term of this patent is extended or adjusted under 35 U.S.C. 154(b) by 0 days.

(21) Appl. No.: 16/261,365

(22) Filed: Jan. 29, 2019

(65) Prior Publication Data

US 2019/0237963 A1    Aug. 1, 2019

(30) Foreign Application Priority Data

Jan. 30, 2018    (DE) .......................... 10 2018 201 422

(51) Int. Cl.
*G01M 3/16*    (2006.01)
*H05K 1/16*    (2006.01)
(Continued)

(52) U.S. Cl.
CPC ............ *H02H 7/0833* (2013.01); *G01M 3/16* (2013.01); *H02H 1/0007* (2013.01); *H05K 1/16* (2013.01); *H05K 2201/10151* (2013.01)

(58) Field of Classification Search
USPC ......................................................... 318/280
See application file for complete search history.

(56) References Cited

U.S. PATENT DOCUMENTS 5,119,002 A * 6/1992 Kato ..................... B60S 1/0818
                                                    318/444
5,801,539 A * 9/1998 Schroder ............... B60S 1/0822
                                                    324/694
(Continued)

FOREIGN PATENT DOCUMENTS

DE          4433447 A1     3/1996
DE     102007028793 A1     1/2009

OTHER PUBLICATIONS

German Search Report for Application No. 10 2018 201 422.1, dated Jul. 3, 2019, 10 pages.

*Primary Examiner* — Bentsu Ro
(74) *Attorney, Agent, or Firm* — Brooks Kushman P.C.

(57) ABSTRACT

An electronic control device for use in a motor vehicle includes an electronic housing for accommodating an electronics system that includes a circuit board, and a resistance sensor for detecting water that has penetrated into the electronic housing. The resistance sensor includes at least two sensor electrodes, each of which is present, at least in one section, in an uninsulated state with respect to the interior of the electronic housing, and a control unit that is configured to detect and evaluate a measured resistance value between the two sensor electrodes. The control unit is further configured to output a trigger signal when the detected measured resistance value or its deviation from a normal value meets a trigger criterion that is characteristic of a contact closure between the two sensor electrodes that is caused by the presence of water in the electronic housing.

20 Claims, 4 Drawing Sheets

(51) Int. Cl.
*H02H 7/08* (2006.01)
*H02H 1/00* (2006.01)

(56) References Cited

U.S. PATENT DOCUMENTS 5,934,987 A * 8/1999 Baruschke ......... B60H 1/00849
  454/75
2006/0242859 A1* 11/2006 Pezier .................... D06F 58/28

* cited by examiner

ELECTRONIC CONTROL DEVICE

CROSS-REFERENCE TO RELATED APPLICATIONS

This application claims priority to German Patent Application No. DE 10 2018 201 422.1 filed Jan. 30, 2018, the entire disclosure of which is incorporated by reference herein.

TECHNICAL FIELD

The disclosure relates to an electronic control device for use in a motor vehicle. The disclosure further relates to a motor vehicle that includes the electronic control device.

BACKGROUND

In motor vehicles, various (electric) motors are usually controlled with the aid of electronic control devices. The control devices typically include a power electronics system that is accommodated, in particular encapsulated or cast, in an electronic housing. Examples of such electronic control devices include actuating motors for automatically adjusting vehicle parts (such as dampers, doors, seats, etc.) or motors of ventilation devices.

Control devices of fan motors are usually attached directly to the vehicle battery without control devices, or the vehicle ignition switch, or other switches situated in between, and are thus permanently connected to the voltage source. In present fan motors, this may be necessary in particular due to the fact that the fans often continue to run for a certain period after the vehicle is switched off (for example, by removing the ignition key).

For control devices of fan motors, the penetration of liquid, typically water, into the electronic housing may be problematic. Since the motor controls are connected directly to the battery voltage without the possibility of being switched off, high currents sometimes flow in the event of a short circuit caused by water, which in the worst case may result in the electronics system and possibly the entire vehicle catching on fire, even when the vehicle is not in operation.

However, penetrating water does not necessarily have to trigger a short circuit. In fact, water may also result in partial functional failures of the electronics system which may be difficult to detect. In particular, water may also result in gradual long-term damage, for example due to corrosion of conductive surfaces.

SUMMARY

An object of the disclosure, therefore, is to provide an electronic control device for a vehicle which ensures particularly reliable operation.

This object may be achieved according to the disclosure set forth below in the various embodiments and refinements of the disclosure.

The control device according to the disclosure may be for use in a motor vehicle includes an electronic housing for accommodating an electronics system that includes a circuit board, and a resistance sensor for detecting water that has penetrated into the electronic housing. The electronics system preferably (but not necessarily) includes at least one power electronics component.

The resistance sensor includes at least two electrically conductive sensor electrodes, each of which is present, at least in one section, in an uninsulated state (without electrical insulation) with respect to the interior of the electronic housing, and a control unit that is configured to detect and evaluate a measured resistance value between the two sensor electrodes. The control unit is further configured to output a trigger signal when the detected measured resistance value or its deviation from a normal value detected in the absence of water meets a trigger criterion that is characteristic of a contact closure between the two sensor electrodes that is caused by the presence of water in the electronic housing. The water to be detected may be present, for example, as an accumulation of liquid (for example, drops or a puddle), as a moisture film deposited on a surface in the electronic housing, or as atmospheric humidity (water vapor). Additionally or alternatively, within the scope of the disclosure the control unit may be configured to detect some other conductive liquid.

In other words, the electronic control device is configured to detect, via a resistance measurement between the two sensor electrodes, water that has penetrated into the electronic housing. The detection is based on the fact that the measured resistance changes significantly in the event of a contact closure of the two sensor electrodes that is caused by the water. Since the moisture detection according to the disclosure is based on an electrical contact closure between the sensor electrodes and water, the sensor electrodes must be present, at least in one section, optionally also completely, without electrical insulation with respect to the housing interior.

The control device according to the disclosure makes it possible, with minimal additional effort, to determine possible penetration of water into the electronic housing and to take suitable measures. As an example, but not limited thereto, when penetration of water is determined, the electronics system is deactivated or a warning message is output to the vehicle user ("have vehicle serviced" message).

For detecting the measured resistance value, in one embodiment the two sensor electrodes are connected in a voltage divider circuit, wherein in particular a resistor component or a resistor module of the voltage divider circuit is bridged at low impedance by water that has penetrated into the electronic housing. The resistor component is in particular implemented by an ohmic resistor. The resistor module may be formed by an RC element that is implemented by a parallel connection of a capacitor and an ohmic resistor.

In one alternative embodiment, the two sensor electrodes are insulated from one another in the absence of water, so that an infinite resistance is formed between the two sensor electrodes in the absence of water. The two sensor electrodes are not electroconductively contactable with one another until water penetrates into the electronic housing. In this case, a non-infinite resistance between the sensor electrodes is measured only when they are bridged by penetrated water.

In one embodiment of the disclosure, one of the sensor electrodes is connected with low impedance to the circuit ground of the electronics system ("measurement against GND") or to a positive battery terminal ("measurement against KL30").

In one embodiment, the control device includes one or more sensor electrodes that are situated on the circuit board of the electronic control device.

If the control device includes multiple measuring points that are implemented by pairs of mutually associated sensor electrodes, their measured values may be linked to one another in a logical AND circuit and/or in a logical OR circuit. An AND circuit advantageously allows a particularly high level of error suppression (false triggering), whereas an OR circuit allows a particularly high probability of detection. Combinations are also possible.

As an example, but not limited thereto, the sensor electrode (or the multiple sensor electrodes) is/are situated on the circuit board as follows:

A sensor electrode or pair of sensor electrodes is situated near the intended lowest circuit board position.

Multiple sensor electrodes or pairs of sensor electrodes are situated at various positions.

One/multiple sensor electrode(s) or pairs of sensor electrodes extend(s) to a significant degree across the circuit board to cover a comparatively large area, so that penetrating water may be detected early in a reliable manner at various installation positions of the control device.

In one embodiment, the two sensor electrodes each form two elongated (uninsulated) measuring lines situated in parallel to one another, so that water may be advantageously detected in a comparatively large area. In an alternative embodiment, only one of the sensor electrodes is designed as an (uninsulated) measuring line, which for detecting a contact closure caused by penetrated water is configured against the electronics system ground. In an alternate embodiment, however, a sensor electrode as a measuring line for detecting a contact closure is configured against the positive battery terminal or any given positive voltage.

In one embodiment that is comparatively easy to implement, the or each sensor electrode is designed as a strip conductor that is provided on the circuit board. The strip conductor in particular has an elongated/extended, flat, or meandering design. In this case, it must be ensured in particular that areas free of solder resist are available for the resistive measurement.

In one embodiment, the electronic housing of the control device is completely or partially made of an electrically conductive material, and acts as one of the two sensor electrodes.

For reasons of electromagnetic compatibility (EMC), the electronics system may be connected to the electronics system ground via an RC element (a parallel connection of a capacitor and a resistor). The housing is hereby contacted with the electronics system via a screw, for example. In this case, due to penetration of water the resistance (impedance) between the screw and the electronics system ground changes measurably compared to the nominal value of the RC element.

In one embodiment, the control unit is configured to output the trigger signal only when a plausibility check is passed. For example in one embodiment, the trigger signal may be triggered only when penetration of water is continuously detected over a specified minimum time period.

In one embodiment, the control unit itself or some other control unit is configured, with regard to the trigger signal, to
place the control device in an emergency mode (emergency operation of the motor or the electronics system),
deactivate the electronics system of the control device (in particular, to deactivate the electronics system via a switchable reverse polarity protector that is present),
cause a short circuit of the electronics system to trigger an associated fuse (as the result of intentionally creating a short circuit within the electronics system, a fuse, present anyway, with a high nominal value is triggered, so that a secure state is established), and/or
output a message to the vehicle user (for example, the vehicle user is prompted to take the vehicle to a repair shop for service, in particular to replace the control device).

The above-mentioned reverse polarity protector is a component which with a reverse-polarity connection of the electronics system (interchanging the positive and negative [terminals]) prevents damage to the electronics system. Instead of a passive reverse polarity protector (diode), a switchable reverse polarity protector (a semiconductor switch, such as a MOSFET) is often used. In the above-mentioned exemplary embodiment, this switchable reverse polarity protector is used as an emergency stop switch for the electronics system.

In one embodiment, the control unit is configured to carry out the detection of the measured resistance value
in control pauses of the electronics system in order to avoid interferences,
in sleep mode via cyclic polling,
only in active mode and after powering on, and/or
only during powering on of the electronics system in order to avoid interferences.

The control device according to the disclosure may be used for controlling a fan motor in a vehicle. However, other applications are also possible within the scope of the disclosure.

A further embodiment of the disclosure is the use of a resistance sensor for detecting the penetration of water or some other conductive or dielectric liquid into an electronic housing of an electronic control device for use in a motor vehicle.

A vehicle according to the disclosure includes a control device according to the disclosure according to the above description.

BRIEF DESCRIPTION OF THE DRAWINGS

Exemplary embodiments of the disclosure are explained in greater detail below with reference to the drawings, which show the following.

Mutually corresponding parts and variables are always provided with the same reference numerals in all figures.

DETAILED DESCRIPTION

Figure 1:
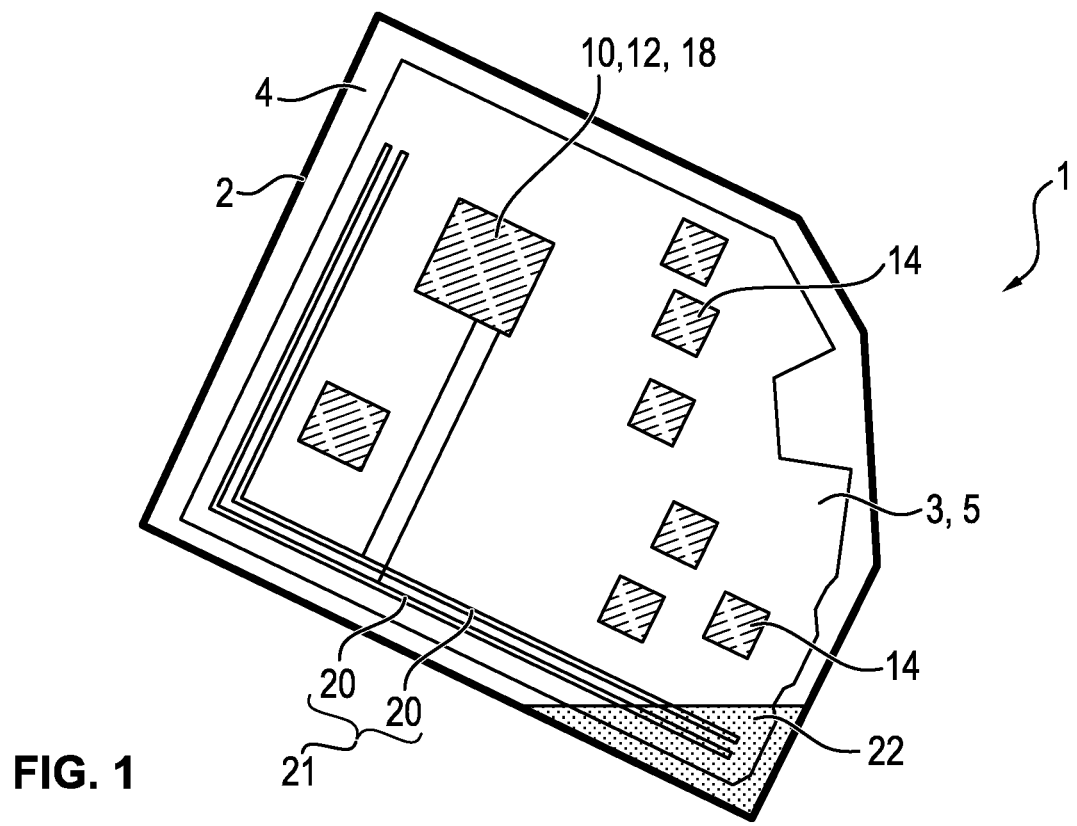
FIG. 1 schematically illustrates a first embodiment of an electronic control device having an electronic housing that accommodates an electronics system that includes a circuit board, and a resistance sensor that includes two sensor electrodes, FIG. 2 schematically illustrates the resistance sensor according to FIG. 1, with the two sensor electrodes connected to one another in a voltage divider circuit.

FIG. 1 shows a roughly schematic top view of an electronic control device 1 for a motor vehicle according to a first embodiment. The control device 1 is used, for example, as a motor control for a fan motor of the vehicle.

The control device 1 includes an electronic housing 2, and an electronics system 3 that is accommodated in a housing interior 4 that is surrounded by the electronic housing 2.

The electronics system 3 is used for controlling the fan motor. The electronics system 3 includes a circuit board 5 on which a microcontroller 10 may be mounted. A first (motor) control unit 12 for controlling the fan motor is implemented by the microcontroller 10. In addition, the electronics system 3 includes further electronic components 14 that may be mounted on the circuit board 5. At least one of the components 14 is optionally an electronic power component such as a MOSFET.

The control device 1 also includes a resistance sensor 16 for monitoring the electronic housing 2 with regard to protection of the electronics system 3 from penetrating water. The resistance sensor 16 includes a (sensor) control unit 18 and two sensor electrodes 20.

In the illustrated exemplary embodiment, the control unit 18 of the resistance sensor 16 is likewise implemented by the microcontroller 10. It is apparent in the illustration that the two sensor electrodes 20 are each designed as elongated strip conductors of the circuit board 5. Each strip conductor extends along two mutually perpendicular outer edges of the circuit board 5, so that each of the two strip conductors approximately forms a capital letter "L." The two strip conductors extend spaced apart from and in parallel to one another. As indicated in the illustration, each of the strip conductors is electroconductively connected to the control unit 18. Two mutually associated sensor electrodes 20 as shown here are also jointly referred to below as a measuring point 21.

The resistance sensor 16 is used to detect water 22 that has potentially penetrated into the electronic housing 2, and to output a trigger signal in the event of detection. The detection is based on the fact that penetrated water 22 electroconductively connects the two sensor electrodes 20 to one another. The control unit 18 is correspondingly configured to detect an electrical resistance that forms between the two sensor electrodes 20 or a variable derived therefrom, and to compare it to a stored normal value that is measured between the two sensor electrodes 20 in the absence of water. The control unit 18 is further configured to output the trigger signal when the deviation of the measured resistance from the normal value exceeds a threshold value that is set as a trigger criterion.

In order for an electrical contact closure to be possible, the sensor electrodes 20 may not be electrically insulated, at least not completely, with respect to the housing interior 4. It must be ensured in particular that areas free of solder resist are present.

Figure 2:
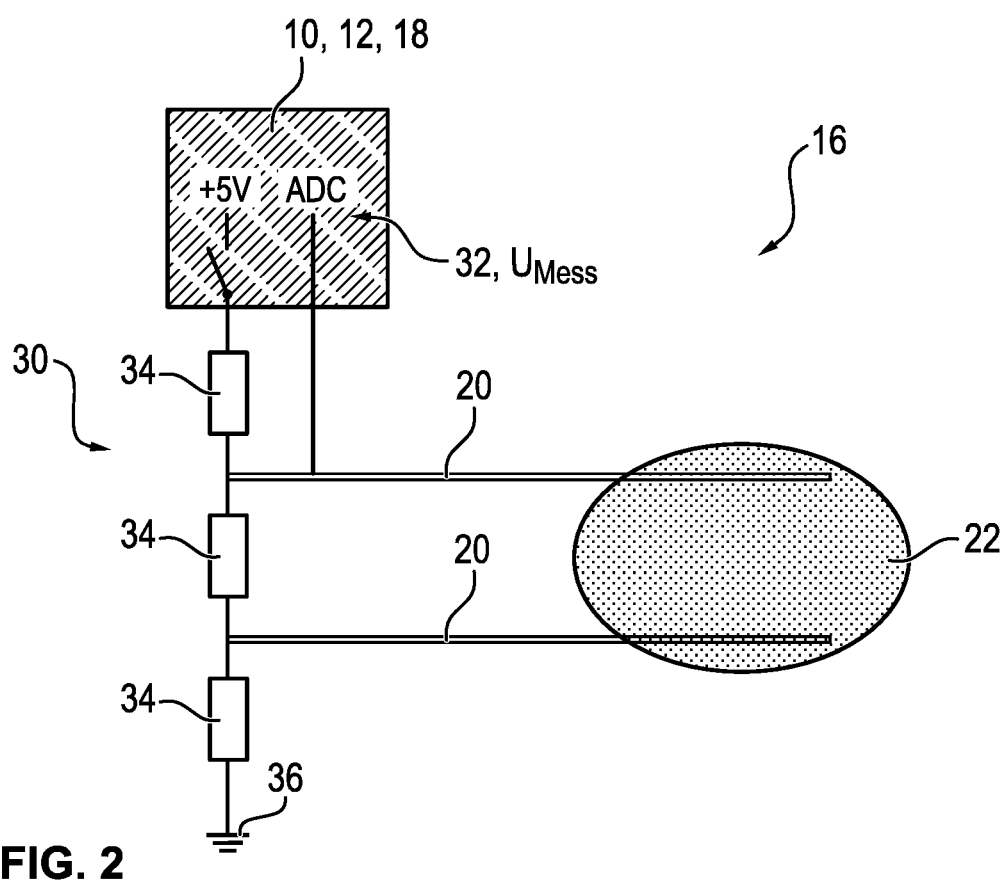

The detection of the resistance takes place with the aid of a voltage divider circuit 30, for example as described below with reference to FIG. 2. FIG. 2 shows an individual illustration of the resistance sensor 16, specifically, the microcontroller 10, the voltage divider circuit 30, and the two sensor electrodes 20.

The microcontroller 10 includes an analog-digital converter 32 (ADC) for digitally detecting a measured voltage UMess, which is used for indirectly detecting the measured resistance value. The voltage divider circuit 30 includes, for example, three identical ohmic resistors 34 connected in series, the two sensor electrodes 20 being connected one on either side of the middle resistor 34. When the two sensor electrodes 20 are electroconductively connected to one another due to water 22 that is present in the electronic housing 2, as indicated in the illustration, the middle resistor 34 is thus bridged with low impedance. Correspondingly, for an applied voltage of 5 V, for example, in the absence of water the control unit 18 detects a measured voltage UMess of >3.5 V, and for a contact closure between the two sensor electrodes 20 that is caused by penetrated water 22, the control unit detects a measured voltage UMess of approximately 2.5 V. Accordingly, the control unit 18 outputs the trigger signal when the measured voltage UMess falls to a value of approximately 2.5 V.

Additionally or alternatively, a short circuit of one of the sensor electrodes 20 with respect to the circuit ground 36 (GND) or with respect to the positive line of the battery (KL30) may be detected.

Figure 3:
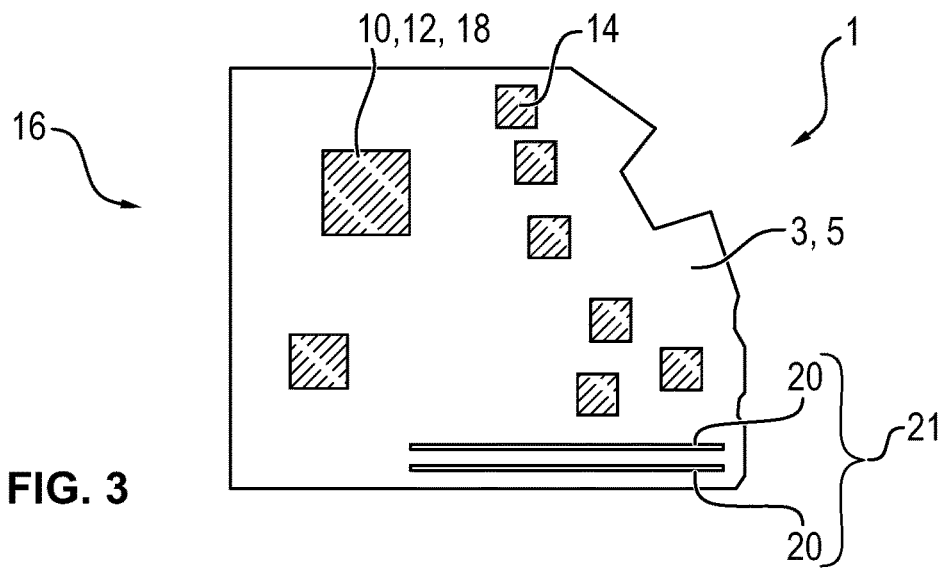
FIGS. 3 through 5 show the electronics system according to FIG. 1 in different embodiments.
Figure 4:
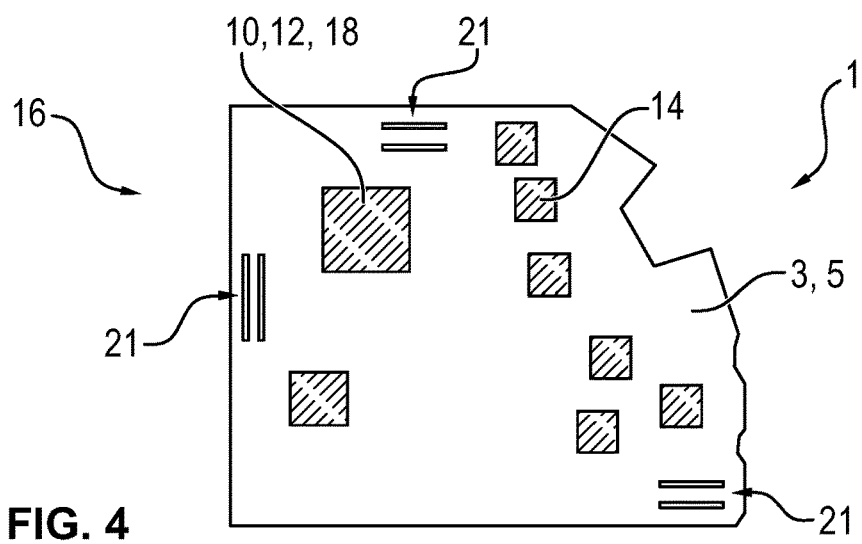
Figure 5:
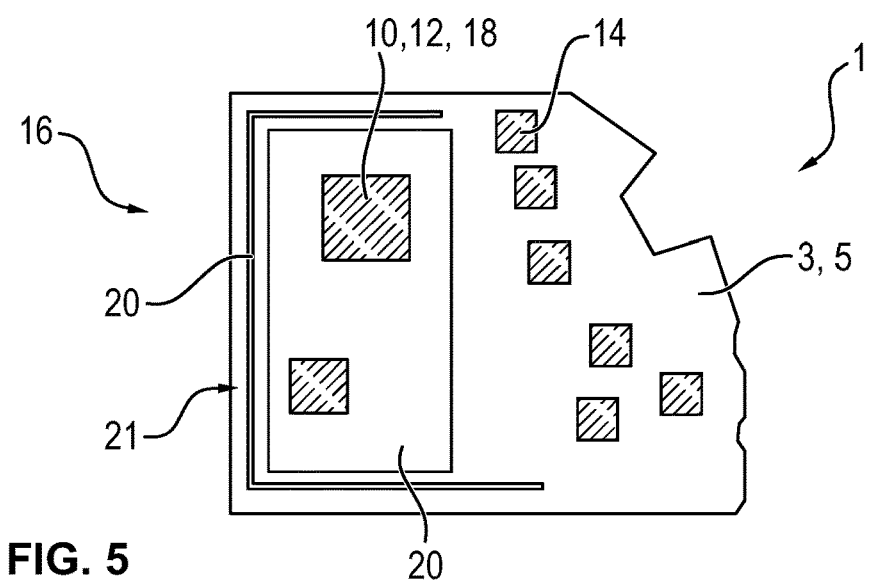

FIGS. 3 through 5 show individual illustrations of the electronics system 3 of the control device 1 according to FIG. 1, with different embodiments with regard to the arrangement of the measuring point 21 being shown. According to FIG. 3, the control device 1, specifically, the resistance sensor 16, includes a measuring point 21 that is formed by two strip conductors that are used as sensor electrodes 20 and that extend along an edge of the circuit board 5. In the intended installation position of the control device 1, the measuring point 21 is situated at the lowest point of the control device 1, so that penetrating water initially accumulates there and is detected early.

According to FIG. 4, multiple measuring points 21, each formed by strip conductors, are situated on the circuit board 5. Two of the measuring points 21 are situated at different positions on the circuit board 5, in each case in the vicinity of the microcontroller 10, in particular to carry out monitoring of liquid in this area. A further measuring point 21 (somewhat analogously to the embodiment according to FIG. 3) is situated in a corner of the circuit board 5, which in the intended installation position of the control device 1 is situated at the lowest point.

According to FIG. 5, one of the sensor electrodes 20 is designed as an elongated conductor structure (strip conductor) that extends in an approximate U shape along three outer edges of the circuit board 5. The other sensor electrode 20 in this case is designed as a flat, rectangular conductor structure that is surrounded by the elongated conductor structure on three longitudinal sides. The flat conductor structure in turn circumferentially encloses the microcontroller 10. The flat conductor structure is hereby formed by a ground plane (GND plane). The ground plane is a conductively coated surface of the circuit board 5 that is not utilized as a strip conductor and that is connected to the circuit ground. Such surfaces remain, for example, after the strip conductors have been etched out of the circuit board, which initially is completely conductively coated. This arrangement allows early detection of penetrated water, largely independent of the installation position of the control device 1.

Figure 6:
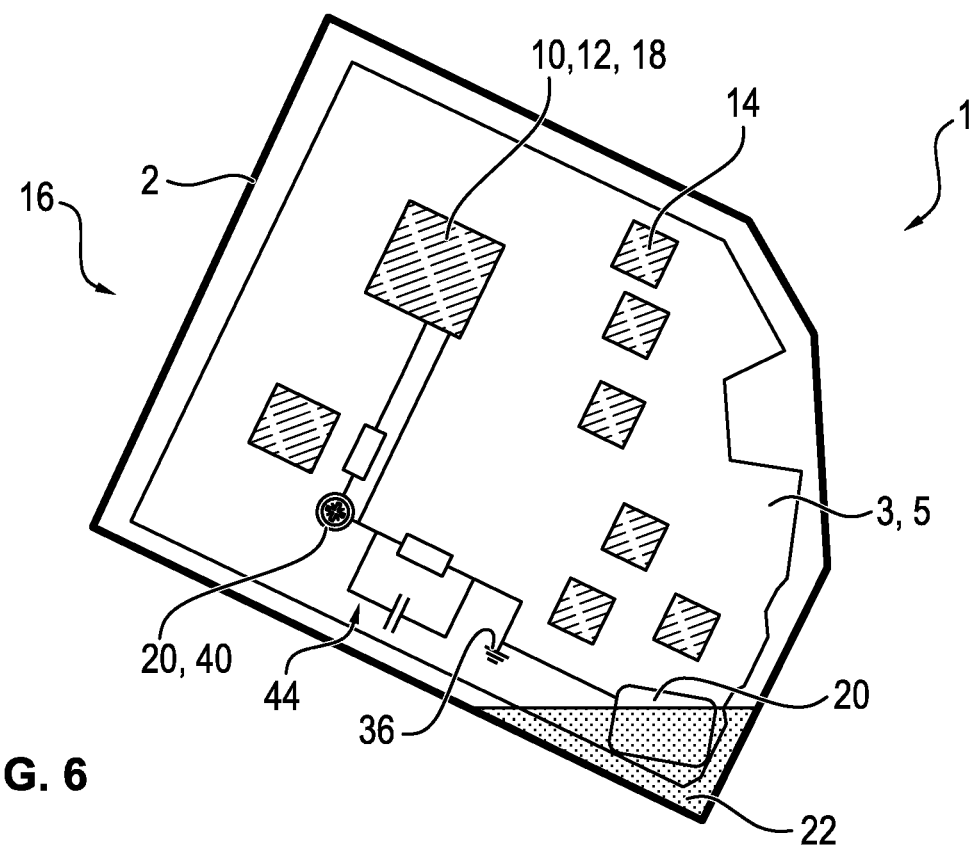
FIG. 6 shows, in an illustration according to FIG. 1, one alternative embodiment of the control device, the electronic housing being made of an electrically conductive material and acting as one of the two sensor electrodes of the resistance sensor.

FIG. 6 shows one embodiment of the control device 1 in which the electronic housing 2 is made of an electrically conductive material. The electronic housing 2 is made of pressure die-cast aluminum, for example. The electronic housing 2 is contacted with the electronics system 3 via an electrically conductive screw 40, for example. For EMC reasons, the housing is not directly short-circuited to the circuit ground 36 of the electronics system 3, but, rather, is connected with high impedance via an RC element 44. The RC element is implemented, for example, by a parallel connection of a capacitor at 100 nF (nanofarads) and an ohmic resistor at 100 kΩ (kiloohms). In this case, only one of the sensor electrodes 20 is situated on the circuit board 5.

In the illustrated exemplary embodiment, this sensor electrode 20 is formed by a flatly extended electrical conductor, for example a metal foil, in particular a copper foil. The second sensor electrode 20 is formed here by the electronic housing 2 and the screw 40.

Figure 7:
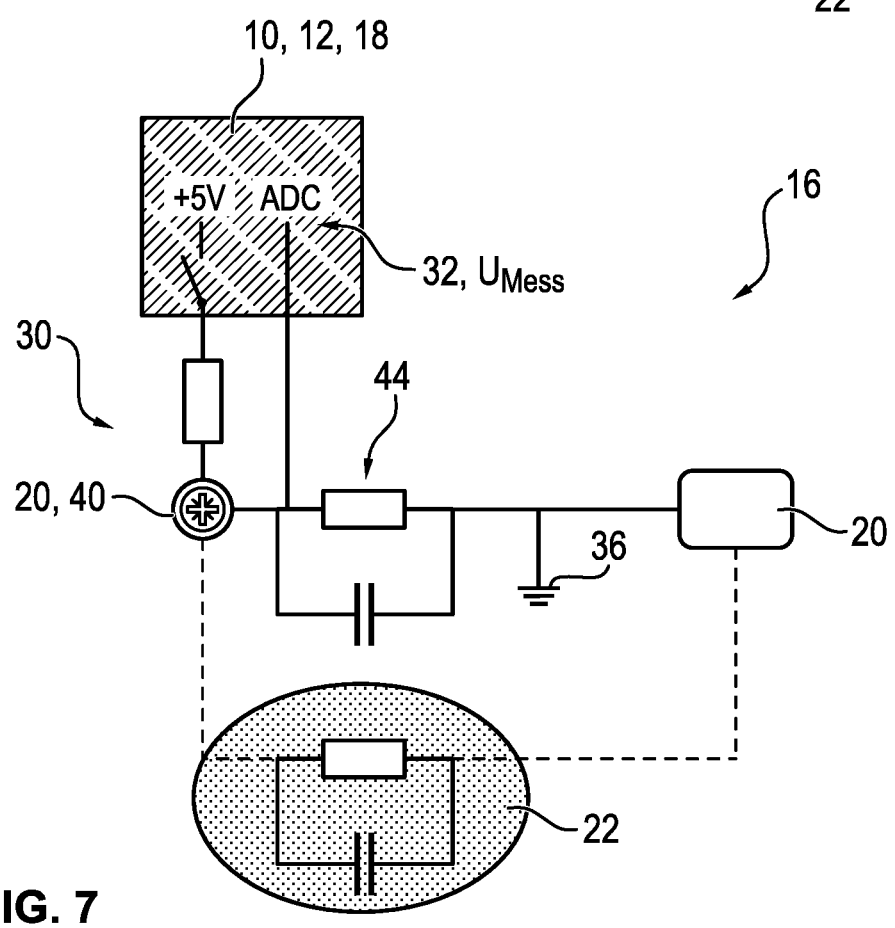
FIG. 7 shows, in an illustration according to FIG. 2, the resistance sensor according to FIG. 6, and FIGS. 8 through 10 show the electronics system according to FIG. 6 in different embodiments.

FIG. 7 shows the resistance sensor 16 in the illustration according to FIG. 2 in a single illustration. The control unit 18 is configured to detect the resistance between the electrode sensor 20, formed by the screw 40 and the electronic housing 2, and the sensor electrode 20 situated on the circuit board 5. For this purpose, the microcontroller is connected, for example, as follows:

1. Standard: microcontroller output=tristate: the motor support is connected to ground via the RC.
2. Resistive measurement: microcontroller output=5 V.

When a contact closure is formed between the two sensor electrodes 20 by penetrated water 22, only a low resistance is measured. In this case as well, the resistance measurement takes place with the aid of a voltage divider circuit 30, wherein the resistance of the RC element 44 is bridged with low impedance due to water 22 that has penetrated into the electronic housing 2. For an applied voltage of 5 V as mentioned above, for example in the absence of water a measured voltage UMess of approximately 2.5 V is measured at the screw 40, whereas in the presence of water 22 a measured voltage UMess of less than 2.5 V is measured at the screw 40, which in this case is used as a trigger criterion.

Figure 8:
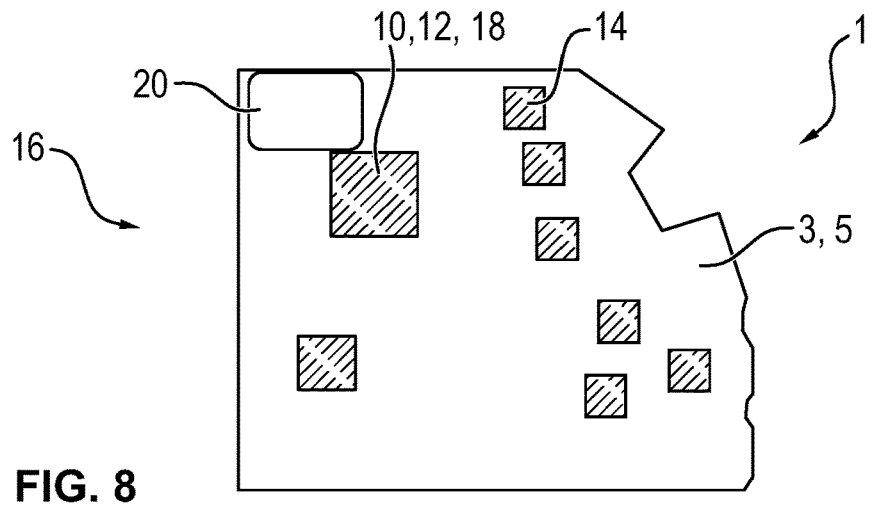
Figure 9:
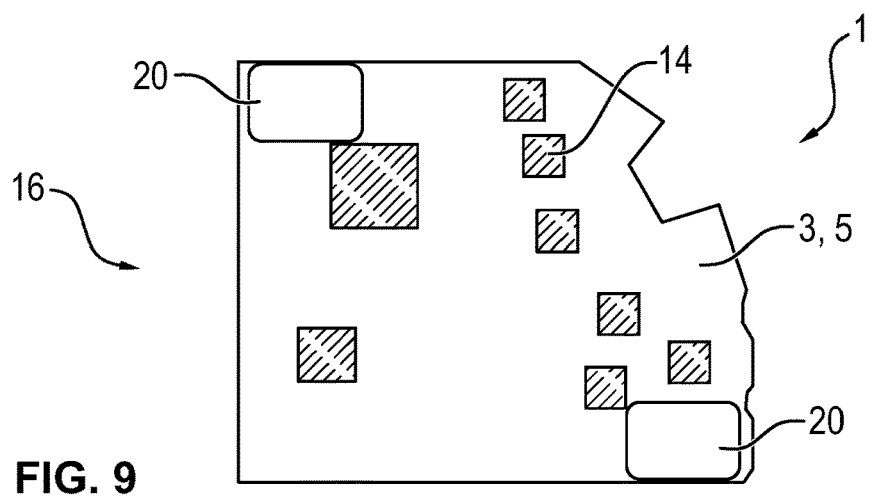
Figure 10:
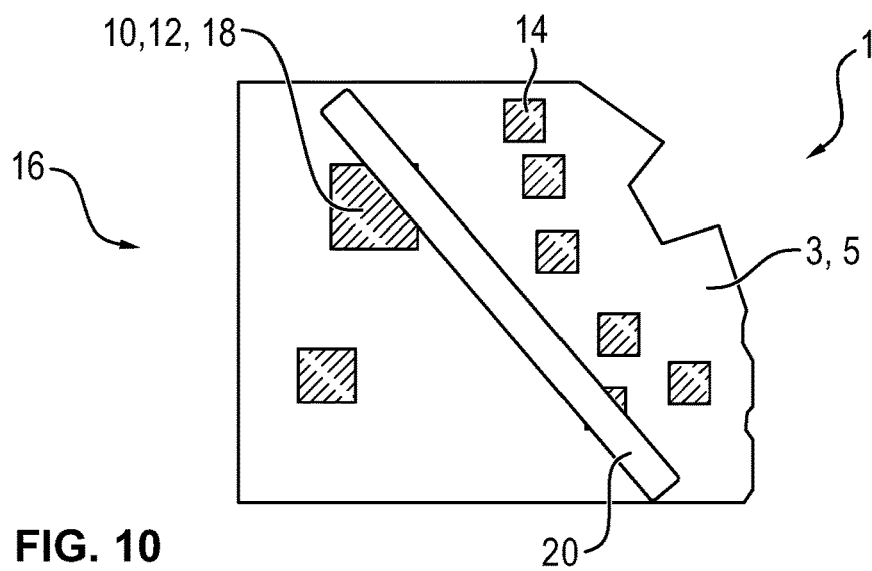

FIGS. 8 through 10 show individual illustrations of the electronics system 3 of the control device 1 according to FIG. 6, showing different embodiments with regard to the arrangement of the sensor electrode 20 situated on the circuit board 5. According to FIG. 8, the flat sensor electrode 20 is situated near the microcontroller 10, in particular to carry out monitoring of water in this area.

According to FIG. 9, the control device 1 includes, for example, two sensor electrodes 20 (alternatively, more than two sensor electrodes) that are situated in opposite corners of the circuit board 5. Early detection of penetrated water is thus possible, regardless of which installation position the control device 1 is mounted in.

According to FIG. 10, the sensor electrode 20 is flatly, longitudinally extended as a strip, and spans the circuit board 5 approximately along the surface diagonals of the circuit board 5. In this case as well, early detection of penetrated water is made possible, regardless of the installation position.

Regardless of the embodiment, the control unit 18 is configured in particular to output the trigger signal only when a plausibility check has taken place and has been assessed as positive. For example, the trigger signal is triggered only when penetration of water is continuously detected over a minimum time period.

With respect to the trigger signal, the control unit 18 itself, which may be a lower-order control unit, brings about the following:

the control device 1 is placed in an emergency mode (emergency operation of the motor or of the electronics system 3),
the electronics system 3 of the control device 1 is deactivated (in particular, the electronics system 3 is deactivated via a switchable reverse polarity protector that is present),
a short circuit of the electronics system 3 is intentionally created to trigger an associated fuse (by intentionally creating a short circuit within the electronics system 3, a fuse, present anyway, with a high nominal value is triggered, so that a secure state is established), and/or
a notification is output to the vehicle user (for example, the vehicle user is prompted via a warning light in the passenger compartment to take the vehicle to a repair shop for service, in particular to replace the control device 1).

The disclosure becomes particularly clear based on the exemplary embodiments described above, but is not limited to these exemplary embodiments. Rather, further embodiments of the disclosure may be derived from the claims and the above description.

LIST OF REFERENCE NUMERALS 1 control device
2 electronic housing
3 electronics system
4 housing interior
5 circuit board
10 microcontroller
12 (motor) control unit
14 component
16 resistance sensor
18 (sensor) control unit
20 sensor electrode
21 measuring point
22 water
30 voltage divider circuit
32 analog-digital converter
34 resistor
36 circuit ground
40 screw
44 RC element
UMess measured voltage

What is claimed is:

1. An electronic control device in a motor vehicle, comprising:
    an electronic housing configured to accommodate an electronics system that includes a circuit board;
    a resistance sensor configured to detect water that has penetrated into the electronic housing, wherein the resistance sensor includes at least two sensor electrodes that includes an uninsulated state section with respect to an interior of the electronic housing, and having a control unit that is configured to detect and evaluate a measured resistance value between the two sensor electrodes,
    wherein the control unit is further configured to output a trigger signal when the detected measured resistance value or its deviation from a normal value meets a trigger criterion that is characteristic of a contact closure between the two sensor electrodes in response to presence of conductive liquid in the electronic housing, wherein the trigger signal is configured to place the electronic control device in an emergency mode and output a notification at the motor vehicle.

2. The electronic control device of claim 1,
    wherein the at least two sensor electrodes are connected in a voltage divider circuit.

3. The electronic control device of claim 1,
    wherein the at least two sensor electrodes are insulated from one another in the absence of liquid in the electronic housing.

4. The electronic control device of claim 3,
    wherein one of the at least two sensor electrodes is connected with low impedance to a circuit ground of the electronics system or to a positive battery terminal.

5. The electronic control device of claim 4,
wherein one of the at least two sensor electrodes is situated on the circuit board.

6. The electronic control device of claim 5,
wherein one of the at least two sensor electrodes is designed as a strip conductor that is provided on the circuit board.

7. The electronic control device of claim 6,
wherein the electronic housing is completely or partially made of an electrically conductive material, and acts as one of the two sensor electrodes.

8. The electronic control device of claim 7,
wherein the electronic housing is connected to the circuit ground of the electronics system with high impedance via an RC element.

9. The electronic control device of claim 8,
wherein the control unit is configured to output the trigger signal only when a plausibility check is passed.

10. The electronic control device of claim 9,
wherein the control unit in response to the trigger signal, is further configured to deactivate the electronics system of the control device, cause a short circuit of the electronics system to trigger an associated fuse, or output a warning message to a vehicle user.

11. An electronic control device in a motor vehicle, comprising:
an electronic housing configured to accommodate an electronics system that includes a circuit board;
a resistance sensor on the circuit board and configured to detect water that has entered the electronic housing, wherein the resistance sensor includes a first and a second sensor electrode, and is further configured to output a trigger signal when water connects the first and the second sensor electrodes; and
a control unit is configured to detect an electrical resistance that forms between the first and second sensor electrodes and output the trigger signal when a deviation of the measured resistance from a normal value exceeds a threshold value that is set as a threshold wherein the trigger signal is configured to place the electronic control device in an emergency mode or deactivate the electronics system of the control device.

12. The electronic control device of claim 11, wherein the first and second sensor electrodes are not electrically insulated from an interior of the electronic housing.

13. The electronic control device of claim 11, wherein the electronic housing includes a voltage divider circuit that includes a plurality of ohmic resistors connected in series.

14. The electronic control device of claim 11, wherein the electronics system is configured to control a fan motor of the vehicle.

15. The electronic control device of claim 11, wherein the first sensor electrode is connected to a circuit ground.

16. The electronic control device of claim 11, wherein the first sensor and the second sensor are insulated from one another in the absence of water.

17. The electronic control device of claim 11, wherein the control unit is configured to detect the electrical resistance that forms between the first and second sensor electrodes in a sleep mode via cyclic polling.

18. The electronic control device of claim 11, wherein the control unit is configured to detect the electrical resistance that forms between the first and second sensor electrodes in an active mode or after powering on.

19. The electronic control device of claim 11, wherein the control unit is configured to output a notification to a vehicle user in response to the trigger signal.

20. An electronic control device in a motor vehicle, comprising:
a housing including a resistance sensor configured to detect water that has entered the housing, wherein the resistance sensor includes a first and a second sensor electrode; and
a control unit configured to detect an electrical resistance that forms between the first and sensor electrodes and output, in response to water connecting the first and second sensor electrodes, a trigger signal when a deviation of the electrical resistance from a normal value exceeds a threshold value that is set, wherein the trigger signal is configured to deactivate the electronics system of the control device or cause a short circuit of the electronics system to trigger an associated fuse.

* * * * *

UNITED STATES PATENT AND TRADEMARK OFFICE
CERTIFICATE OF CORRECTION

PATENT NO. : 10,734,801 B2
APPLICATION NO. : 16/261365
DATED : August 4, 2020
INVENTOR(S) : Holger Wuerstlein It is certified that error appears in the above-identified patent and that said Letters Patent is hereby corrected as shown below:

In the Claims

Column 10, Line 34, Claim 20:
After "that forms between the first and"
Insert -- the second --.

Signed and Sealed this
Twenty-fourth Day of May, 2022

*Katherine Kelly Vidal*

Katherine Kelly Vidal
*Director of the United States Patent and Trademark Office*